(12) United States Patent
Kameko et al.

(10) Patent No.: US 9,660,404 B2
(45) Date of Patent: May 23, 2017

(54) TERMINAL CONNECTION STRUCTURE FOR RESISTOR

(71) Applicant: KOA CORPORATION, Ina-shi, Nagano (JP)

(72) Inventors: Kenji Kameko, Ina (JP); Koichi Hirasawa, Ina (JP); Yoshinori Aruga, Ina (JP)

(73) Assignee: KOA CORPORATION, Ina-shi (JP)

( * ) Notice: Subject to any disclaimer, the term of this patent is extended or adjusted under 35 U.S.C. 154(b) by 118 days.

(21) Appl. No.: 14/374,712

(22) PCT Filed: Jan. 29, 2013

(86) PCT No.: PCT/JP2013/051823
§ 371 (c)(1),
(2) Date: Jul. 25, 2014

(87) PCT Pub. No.: WO2013/121872
PCT Pub. Date: Aug. 22, 2013

(65) Prior Publication Data
US 2014/0370754 A1    Dec. 18, 2014

(30) Foreign Application Priority Data

Feb. 14, 2012 (JP) ................................. 2012-029274

(51) Int. Cl.
*H01C 7/00* (2006.01)
*H01R 33/18* (2006.01)
(Continued)

(52) U.S. Cl.
CPC ............ *H01R 33/18* (2013.01); *G01R 1/203* (2013.01); *H01C 1/14* (2013.01); *H01R 13/46* (2013.01)

(58) Field of Classification Search
CPC . H01C 1/14; H01C 10/46; H01C 1/16; H01R 33/18; H01R 13/46
(Continued)

(56) References Cited

U.S. PATENT DOCUMENTS 8,471,674 B2 *  6/2013  Yoshioka ............... G01R 1/203
                                                    29/610.1
2014/0125429 A1 *  5/2014  Yoshioka ................. H01C 1/14
                                                    333/172

FOREIGN PATENT DOCUMENTS

JP   2009-182144 A   8/2009
JP   2009-216620 A   9/2009
(Continued)

OTHER PUBLICATIONS

Yoshioka, Shunt Resistor, English machine translation of JP 2011-018759, Jan. 27, 2011.*
(Continued)

*Primary Examiner* — Kyung Lee
(74) *Attorney, Agent, or Firm* — Westerman, Hattori, Daniels & Adrian, LLP

(57) ABSTRACT

Provided is a connection structure for a detection terminal of shunt resistor that allows a lead wire, that is to be connected to an electrode of the shunt resistor and is for detecting electrical current, to be easily and compactly connected to the electrode within a narrow and small module. A terminal connection structure for a resistor, which connects a detection terminal to an electrode, comprises a shunt resistor (13) that has a pair of electrodes (12) at both ends of a resistor body (11); a connector base (14) formed of insulating material; and an electrically conductive section (15a) formed on the connector base (14); wherein the connector base (14) is fit onto the shunt resistor (13) such that the electrically conductive section (15a) is electrically connected to the electrodes (12). The connector base (14) is
(Continued)

provided with a joint section (C) that can be fit onto the resistor body (11). The resistor body (11) and the electrode (12) is provided with a level difference and the connector base (14) is fit into between the electrodes (12,12).

4 Claims, 4 Drawing Sheets

(51) Int. Cl.
  *H01C 1/14*     (2006.01)
  *G01R 1/20*     (2006.01)
  *H01R 13/46*    (2006.01)
(58) Field of Classification Search
  USPC ............... 338/49, 204, 322, 329; 439/620.01
  See application file for complete search history.

(56)         References Cited

FOREIGN PATENT DOCUMENTS

| JP | 2011-18759 A   | 1/2011 |
|----|----------------|--------|
| WO | 2011/068205 A1 | 6/2011 |

OTHER PUBLICATIONS

International Search Report dated Apr. 23, 2013, issued in corresponding application No. PCT/JP2013/051823.

\* cited by examiner

TERMINAL CONNECTION STRUCTURE FOR RESISTOR

TECHNICAL FIELD

The invention relates to a resistor, especially relating to a terminal connection structure for detecting a voltage that is formed at both ends of the resistor body by current to be watched, which flows through the resistor body of the shunt resistor.

BACKGROUND ART

The shunt resistor is used for observing current of electrical circuit. The shunt resistor is inserted in the route of the current to be watched for detecting voltage formed at both ends of the resistor body by the current, and the current is detected from already-known resistance value. For instance, a shunt resistor that fixed electrodes at both ends of the resistor body of pillar-shaped has been disclosed in Japanese laid open patent publication 2009-216620. According to the shunt resistor, a structure that directly connects ends of lead wires to the electrodes by welding as detecting terminal, is disclosed, where the terminal takes out voltage formed at both ends of the resistor body (refer to FIG. 1 and FIG. 2).

SUMMARY OF INVENTION

Technical Problem

The shunt resistor is installed, for instance, in an intelligent power module (IPM), which is used for motor drive control etc. In this case, especially in case of resistor having low resistance value of less than 1 mΩ, it might be difficult to weld lead wire directly on the electrodes for voltage detection since electronic equipments become minute. Further, according to tendency that electronic equipments become minute, there is a problem that arranging lead wire of wiring for voltage detection in a narrow module becomes difficult.

The invention has been made basing on above-mentioned circumstances. Therefore object of the invention is to provide a detection terminal connection structure for a shunt resistor, which can connect lead wire for voltage detection on the electrodes of the resistor in narrow module easily and compactly.

Solution to Problem

The terminal connection structure for a resistor, which connects a detection terminal to an electrode, of the invention comprises a shunt resistor that has a resistor body and a pair of electrodes; a connector base formed of insulating material; and an electrically conductive section formed on the connector base; wherein the connector base is fit onto the shunt resistor such that the electrically conductive section is electrically connected to the electrodes.

According to the invention, since the detection terminal can be connected to the electrodes only by connector base being fit into between both electrodes of the resistor, it makes welding operation that has been done in past unnecessary, and it makes terminal of lead wire connecting to electrodes of the resistor for voltage detection in narrow module easily and compactly.

DESCRIPTION OF EMBODIMENTS

Figure 1:
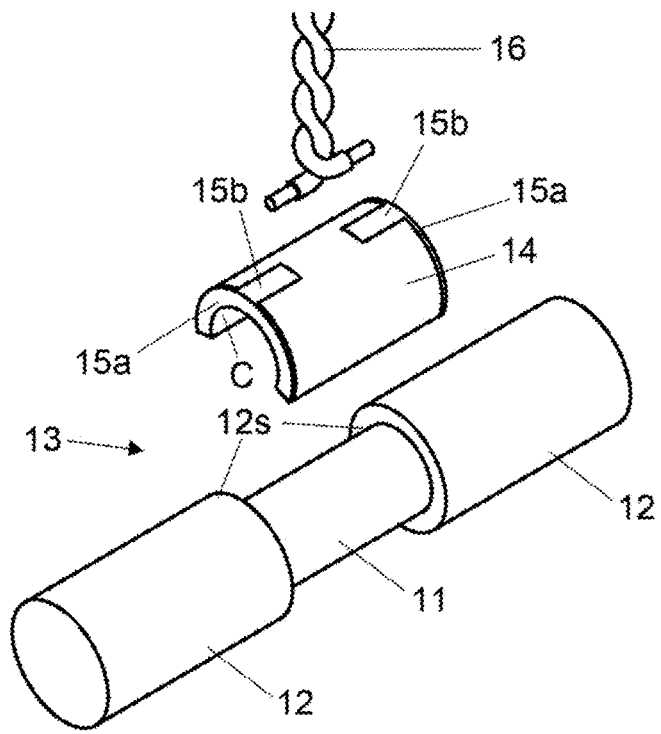
FIG. 1 is an exploded perspective view, which shows terminal connection structure for the shunt resistor of first embodiment of the invention.

Embodiments of the invention will be described below with referring to FIG. 1-FIG. 8. Like or corresponding parts or elements will be denoted and explained by same reference characters throughout views.

Figure 2:
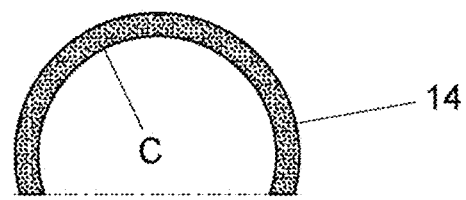
FIG. 2 is a cross-sectional view, which shows a cross-section of connector base along vertical plane to its axial direction.
Figure 3:
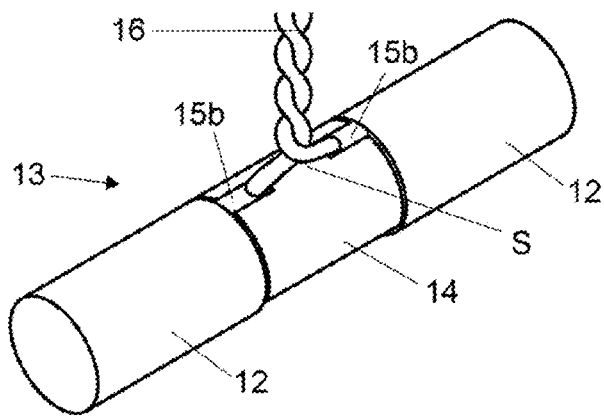
FIG. 3 is a perspective view, which shows terminal connection structure for the resistor at finished stage.

FIGS. 1-3 shows a terminal connection structure of first embodiment of the invention. The terminal connection structure, which connects a detection terminal to an electrode, is provided with connector base 14 that has elasticity, and consisting of insulating material, and has detecting terminal for voltage detection by connecting to electrode 12 of shunt resistor 13. By connector base 14 being fit onto outer surface of resistor body 11 by the elasticity, end face of conductivity section 15a, which comprises detection terminal, is connected to electrode 12, and electrically conducted.

The shunt resistor 13 has suitable structure to obtain low resistance value of less than several mΩ, particularly, of 0.1 mΩ-1 mΩ. Though, in the resistor, axial length of resistor body 11 (distance between both electrodes) becomes small comparing to section of resistor body 11, the connector base 14 has joint section C that can be fit onto outer surface of resistor body 11. The structure will be explained particularly as follows.

The resistor 13 has resistor body 11 consisting of metal resistor material such as copper nickel alloy, nickel chrome alloy, and copper nickel manganese alloy, etc., and is processed to be columnar or cylindrical. The resistor body 11 is inserted between electrodes 12, 12 (its shape may be columnar as shown in the figure, square pillar or other shape acceptable) consisting of such as copper. End face of resistor body 11 and end face of electrode 12 are abutted and bonded.

Here, diameter of electrode 12 is larger than diameter of resistor body 11, and a level difference is formed. For instance, it is preferable to form the level difference of about 0.5 mm by using that diameter of electrode is larger than diameter of resistor body about 1 mm. Further, inner end face 12s (resistor body side) of electrode 12 has flat face at the level difference on bonded face with resistor body 11.

As shown in FIG. 2, the connector base 14 has joint section C that can be fit onto outer surface of resistor body 11, and has cylindrical shape that one side opened. And, the connector base 14 is formed with an insulation material such as plastic etc. that has some elasticity. It is preferable that the connector base 14 has inside diameter as the same diameter with outside diameter of resistor body 11. The joint section C opens according to elastomeric force when the connector base 14 is fit onto outer surface of resistor body 11, and after being fit, it close by elastomeric force that can maintain fixed state stably. By having joint section C, the connector base 14 consisting of insulation material that has elasticity is easily fit onto outer surface of column or cylinder shaped resistor body 11, and it can be fixed so as not to come off easily.

Thickness of joint section C of the connector base 14 is preferable to be about 0.5-1 mm. Length of the connector base 14 is to be the same degree of length of the resistor body 11. As a result, both axially end faces of the connector base 14 comes in contact with end face 12s of the electrode 12 where the level difference is formed, and it enters the state that the connector base 14 is mostly buried in the level difference, which is formed by the resistor body 11 and the electrodes 12.

The conductive section 15a is formed at both end faces of connector base 14 in axial direction by plating, dipping, or printing of conductive material (refer to FIG. 1). Similarly, the conductive section 15b is formed at outer surface of connector base 14, connecting to conductive section 15a and extending along axial direction, and is formed by plating or printing etc. of conductive material. The detection terminal consists of conductive section 15a and conductive section 15b. Ends of lead wire 16 consisting of strand wire are fixed on conductive sections 15b by soldering or welding etc. Further, an insulation film may be inserted between resistor body 11 and connector base 14 so that conductive section 15a will not come into contact with resistor body 11.

Space S is formed with two lead wires dividing part from wiring 16 and two lead wires connecting part to conductive material 15a, 15b. It is desirable to make space S constant an area as possible, and to reduce the area as small as possible. In other words, it is desirable to dispose each lead wire from wiring 16 close to connector base 14 as possible. By disposing so, difference of current detection by influence of magnetic flux generated in resistor 13 can be suppressed. This respect is similar in second embodiment and third embodiment. Further, it is preferable for wiring 16 to use strand wire or shield wire for reducing influence of external magnetic flux.

As shown in FIG. 3, by connector base 14 fit into between level differences formed by resistor body 11 and electrode 12, the conductive section 15a electrically conducts to end face 12s of electrode 12. And, voltage between end faces 12s,12s is transmitted to voltage detection device (not shown) via conductive section 15b and wiring 16, and voltage between both end faces of resistor body 11 along axial direction is detected, and current flowing through resistor body 11 is detected by already known resistance value.

The conductive section 15a connects to resistor 13 at face 12s, where electrodes 12, 12 are opposed mutually, and detects electric potential at inner face of electrode 12 (voltage between both end faces of resistor body in axial direction). Thus, it becomes possible to detect voltage formed in resistor body 11 by current to be watched with good accuracy. Moreover, detection terminal can be connected to electrodes only by connector base 11 being fit onto outer face of resistor body 11. Thus, welding operation that has been done previously becomes to be unnecessary, and the detection terminal can be connected to the electrodes of shunt resistor easily and compactly in a narrow module. Further, the fixed position of connector base 14 to resistor 13 becomes stable, and no difference caused.

In the example shown in the figures, a level difference is installed between resistor body and electrodes, and conductive sections on both end faces of connector base are abutted and connected to both inner end faces of electrodes. However, such level difference may not be installed, and conductive sections of connector base may connect to outer surfaces of electrodes at both ends of resistor body by connector base fit onto outer surfaces of electrodes. Moreover, in this case, it is necessary to install conductive sections on inner surfaces of connector base 14 at both ends, which also connecting to wiring 16.

In case of detecting current that changes time-wise by using the shunt resistor, a little inductance component in the current causes a big error to detection value by the skin effect. Such error can be controlled by making the resistor body a minute diameter described as follows. From the viewpoint, it is advantageous to provide the step difference by making resister body thinner than electrodes, than providing no step difference by making resistor body as same diameter with electrodes.

Figure 4:
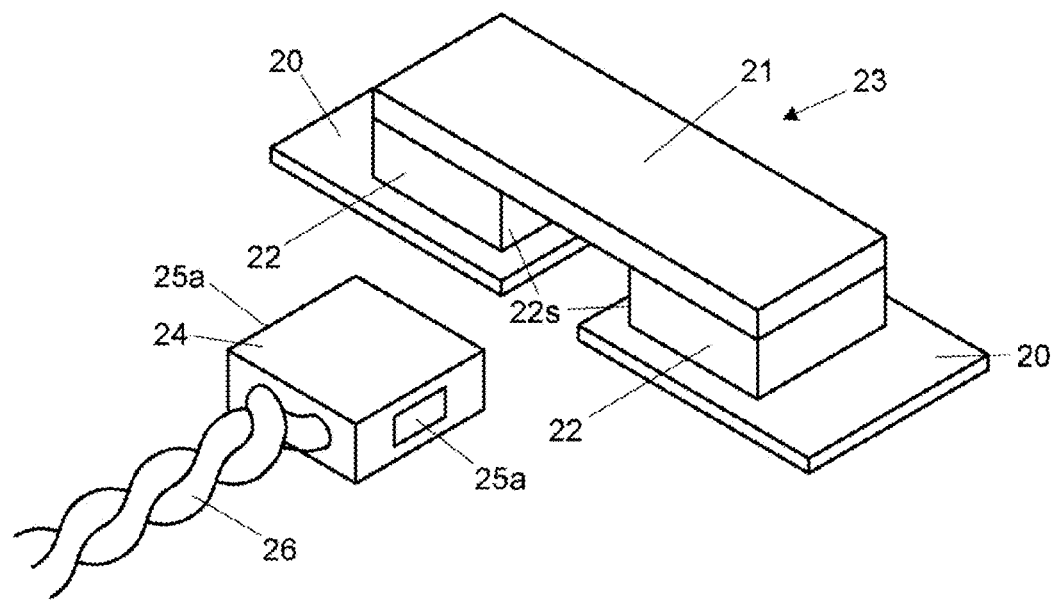
FIG. 4 is an exploded perspective view, which shows terminal connection structure for the shunt resistor of second embodiment of the invention.
Figure 5:
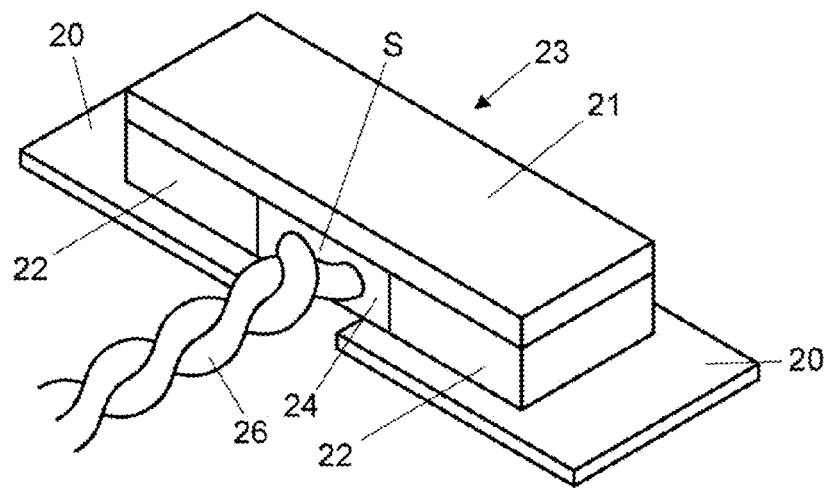
FIG. 5 is a perspective view, which shows terminal connection structure for the resistor at finished stage.

FIGS. 4-5 shows a terminal connection structure for resistor of second embodiment of the invention. According to the shunt resistor 23, which has been surface-mounted, it is also possible to detect current by connector base 24 having conductive section 25a by using inner end face 22s of electrode 22. That is, the shunt resistor 23 has electrodes 22, 22 at both ends of lower surface of plate-shaped resistor body 21, and the electrode 22 is connected to current wiring 20 on mount substrate.

The connector base 24 consisting of insulation material such as plastic etc. that has some elasticity, has conductive section 25a at both end faces thereof. The detection terminal is consisting of conductive section 25a in this embodiment. The conductive section 25a is connected to lead wire 26 by internal wiring. As shown in FIG. 5, inserting connector base 24 between both electrodes 22, 22 of the resistor, the conductive sections 25a on both end faces of connector base 24 connect to end faces 22s of electrodes 22, 22 of the resistor, and electrically conducted.

As a result, voltage between both end faces 22s, 22s of electrodes is transmitted to voltage detection device (not shown), via conductive section 25b and lead wire 26, and current flowing through resistor body 21 is detected. In this embodiment, by detecting electric potential at inner end faces (voltage between both electrodes of resistor body), it becomes possible to precisely detect voltage formed in the resistor body 21 by current to be watched.

Figure 6:
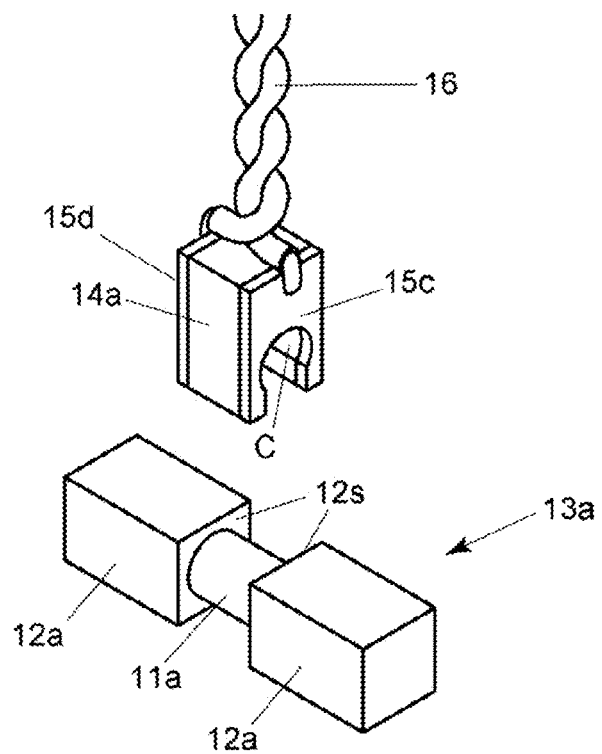
FIG. 6 is a perspective view, which shows terminal connection structure for the shunt resistor of third embodiment of the invention.
Figure 7:
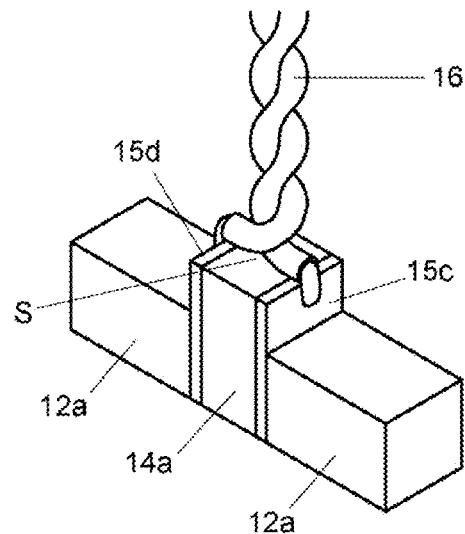
FIG. 7 is a perspective view, which shows terminal connection structure for the resistor at finished stage.

FIGS. 6-7 shows a terminal connection structure of third embodiment of the invention. According to the shunt resistor 13a, which has been surface-mounted, it is possible to detect the current flowing through the resistor body 11a by connector base 14a being fit onto the resistor body 11a, and terminal sections (conductive sections) 15c,15d being electrically conducted to inner end faces 12s, 12s of electrodes 12a, 12a. Terminal sections 15c, 15d comprise the detection terminal in the embodiment. Here, shunt resistor 13a of surface-mount-type is provided with square pillar-shaped electrode 12a at both end faces of resistor body 11a of columnar or cylindrical type, and bottom face of electrode 12a is connected to land pattern on mount substrate by surface mounting.

Insulation material that has some elasticity such as resin etc. is suitable for connector base 14a, and glass epoxy plate etc. is adopted for the base 14a in this embodiment. The connector base 14a is provided with joint section C that can be fit onto outer surface of resistor body 11a and terminal sections 15c,15d of metal material such as copper etc. at both end faces. Terminal sections 15c, 15d are connected to lead wire 16. Strand wire or shield wire is used for lead wire 16 so as to reduce influence of magnetic flux from outside.

Further, as an example of manufacturing method for connector base 14a, it can be formed by using glass-epoxy plate having copper foil on both surface thereof, and cutting or stamping the plate.

FIG. 7 shows a state that connector base 14a is fit onto resistor body 11a. Each of terminal sections 15c, 15d is connected to each of end faces of electrodes 12a, 12a (abutting to face 12s). Joint section C of connector base 14a may be fixed on resistor body 11a by adhesive. Further, thickness of connector base 14a including terminal sections 15c, 15d is almost same with distance between electrodes 12a, 12a, or a little thicker. It is preferable for connector base 14a to be press-fit into between electrodes 12a, 12a, as a result, connection situation of each electrode 12a and terminal section 15c, 15d becomes excellent. As another example, using that linear expansion coefficient of glass epoxy plate is very high in general, reducing thickness of connector base 14a consisting of glass epoxy plate by cooling to cold state that is lower than normal temperature, putting the connector base to be fit into between electrodes 12a, 12a and returning the connector base to normal temperature, makes it possible to assemble the connector base strongly. Further, keeping the connector base at normal temperature, or at cold state lower than normal temperature, heating resistor so as to expand distance between electrodes by thermal expansion, putting the connector base to be fit into between electrodes, and returning it to normal temperature, may be also possible.

As a result, the voltage between both end faces 12s, 12s of electrodes is transmitted to voltage detection device (not shown) via terminal sections 15c, 15d and lead wire 16. Then, the voltage between both electrodes 12a, 12a of resistor body 11a is detected, and the current flowing through resistor body 11a is detected.

In this embodiment, using resistor body 11a of thin diameter, and detecting electric potential of inner end faces of electrodes 12a, 12a (voltage between both electrodes of resistor body), makes it possible to detect current to be watched, which includes some high frequency component, in high accuracy. That is; resistor body 11a is formed to a thin diameter whose diameter is 4 mm or less between electrodes 12a, 12a. Concretely, diameter of from 1 to 4 mm is used, and length of resistor body is adjusted properly according to resistance value. As an example, in case of obtaining resistance value of 0.2 mΩ by using Cu—Mn—Ni system alloy where cross section is circle, the resistor body should have diameter $\phi$ to be 2 mm and length (distance between electrodes) to be 1.42 mm. According to detection terminal connection structure of the invention, if distance between electrodes is several mm (for instance, 5 mm or less), detection terminal can be suitably connected. Moreover, resistance value can be fine-controlled by cutting surface of resistor body etc. The basis of a shunt resistor is for detection of direct current. However, by making resistor body 11a thin diameter, decrease of current path by skin effect is not caused for high frequency current to some degree, and current detection for high frequency in some degree becomes possible in high accuracy as well as direct current.

Figure 8:
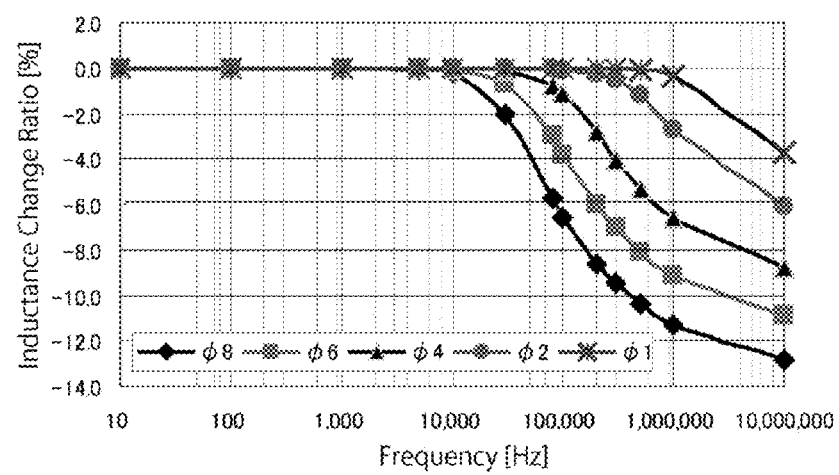
FIG. 8 is a graph, which shows frequency characteristics of inductance change ratio corresponding to diameter of resistor body of the resistor.

FIG. 8 shows frequency characteristics of inductance change ratio, which corresponds to diameter ($\phi$1 mm-$\phi$8 mm) of resistor body that cross section is circle. When inductance rises, big error will be caused especially in detection of high frequency current. As to inductance change ratio as well as resistance change ratio, when diameter of resistor body thinner, it is understood to be able to use the resistor for some high frequency area as shunt resistor. Accordingly, as described above, by using resistor body of diameter being less than 4 mm ($\phi$4 mm) wherein cross section is circle, the shunt resistor can be suitably used for detecting high frequency current. Moreover, as to cross section of resistor body, though circle is preferable, however even if it is a polygon, by making the diameter thinner, similar effect can be obtained.

Although embodiments of the invention has been explained, however the invention is not limited to above embodiments, and various changes and modifications may be made within scope of the technical concept of the invention.

INDUSTRIAL APPLICABILITY

The invention can be suitably used for a detection terminal connection structure, which detects a voltage between both ends of a resistor caused by a current to be watched flowing through the shunt resistor.

The invention claimed is:

1. A terminal connection structure for a resistor, which connects a detection terminal to an electrode, comprising:
   a shunt resistor that has a resistor body and a pair of electrodes;
   a connector base formed of insulating material and having elasticity; and
   an electrically conductive section formed on the connector base;
   wherein the connector base is fit onto the shunt resistor by the elasticity such that the electrically conductive section is electrically connected to the electrode.

2. The terminal connection structure for the resistor according to claim 1, wherein the connector base is provided with a joint section that can be fit onto the resistor body.

3. The terminal connection structure for the resistor according to claim 1, wherein the resistor body and the electrodes are provided with a level difference and the connector base is fit into between the electrodes.

4. The terminal connection structure for the resistor according to claim 1, wherein the shunt resistor is provided with a columnar or cylindrical resistor body, which is formed to a thin diameter whose diameter is no more than 4 mm.

* * * * *